(12) United States Patent
Kim et al.

(10) Patent No.: US 11,335,225 B2
(45) Date of Patent: May 17, 2022

(54) STRETCHABLE DISPLAY DEVICE

(71) Applicant: LG Display Co., Ltd., Seoul (KR)

(72) Inventors: Seulki Kim, Seosan-si (KR); Hyunju Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/029,926

(22) Filed: Sep. 23, 2020

(65) Prior Publication Data
US 2021/0158734 A1 May 27, 2021

(30) Foreign Application Priority Data
Nov. 21, 2019 (KR) .................. 10-2019-0150697

(51) Int. Cl.
G09G 3/00 (2006.01)
G09G 3/3233 (2016.01)
G09G 3/3266 (2016.01)
H01L 51/00 (2006.01)
H01L 27/32 (2006.01)
H01L 25/16 (2006.01)

(52) U.S. Cl.
CPC .......... *G09G 3/035* (2020.08); *G09G 3/3233* (2013.01); *H01L 25/162* (2013.01); *H01L 25/167* (2013.01); *H01L 27/3293* (2013.01); *H01L 51/0097* (2013.01); *G09G 3/3266* (2013.01); *G09G 2320/0233* (2013.01); *G09G 2380/02* (2013.01); *H01L 27/3258* (2013.01); *H01L 27/3276* (2013.01)

(58) Field of Classification Search
CPC ............................ G09G 3/35; G09G 2380/02
See application file for complete search history.

(56) References Cited

U.S. PATENT DOCUMENTS

| | | | |
|---|---|---|---|
| 6,362,798 B1 * | 3/2002 | Kimura ................ | G09G 3/3291 345/55 |
| 9,468,050 B1 * | 10/2016 | Rotzoll .................... | G09G 3/32 |
| 2016/0320878 A1 * | 11/2016 | Hong ..................... | G09G 3/035 |
| 2018/0197471 A1 * | 7/2018 | Rotzoll ................ | G09G 3/2003 |

* cited by examiner

*Primary Examiner* — Kevin M Nguyen
(74) *Attorney, Agent, or Firm* — Seed IP Law Group LLP

(57) ABSTRACT

One or more embodiments of the present disclosure provides a stretchable display device. The stretchable display device includes a lower substrate including a display area and a non-display area, a plurality of first substrates and a plurality of second substrates disposed in the display area, a plurality of light emitting elements disposed on each of the plurality of first substrates, a switching transistor and a driving transistor disposed on each of the plurality of second substrates, in which the switching transistor may output a data signal to the driving transistor in accordance with a scan signal and the driving transistor may output a driving current to the light emitting element in accordance with the data signal.

17 Claims, 9 Drawing Sheets

STRETCHABLE DISPLAY DEVICE

CROSS-REFERENCE TO RELATED APPLICATION

This application claims the priority of Korean Patent Application No. 10-2019-0150697 filed on Nov. 21, 2019, in the Korean Intellectual Property Office, the disclosure of which is incorporated herein by reference.

BACKGROUND

Technical Field

The present disclosure relates to a stretchable display device, and more particularly to a stretchable display device including a compensation circuit.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

One or more embodiments of the present disclosure provides a stretchable display device which compensates for a luminance in accordance with how much the stretchable display device is extended.

One or more embodiments of the present disclosure provides a stretchable display device which suppresses the luminance irregularity.

Technical benefits of the present disclosure are not limited to the above-mentioned benefits, and other benefits, which are not mentioned above, can be clearly understood by those skilled in the art from the following descriptions.

In order to achieve the above-described benefits, according to an aspect of the present disclosure, a stretchable display device includes a lower substrate including a display area and a non-display area; a plurality of first substrates and a plurality of second substrates disposed in the display area; a plurality of light emitting elements disposed on each of the plurality of first substrates; a switching transistor and a driving transistor disposed on each of the plurality of second substrates, in which the switching transistor may output a data signal to the driving transistor in accordance with a scan signal and the driving transistor may output a driving current to the light emitting element in accordance with the data signal.

In order to achieve the above-described benefits, according to another aspect of the present disclosure, a stretchable display device includes a soft substrate including a display area and a non-display area; a first rigid substrate and a second rigid substrate which are disposed in the display area and are adjacent to each other; and a plurality of sub-pixels disposed on the first rigid substrate and the second rigid substrate, and each of the plurality of sub-pixels includes: a light emitting element and a compensation transistor disposed on the first substrate; a driving transistor disposed on the second substrate; and a compensation capacitor formed between the first substrate and the second substrate.

Other detailed matters of the embodiments are included in the detailed description and the drawings.

According to the present disclosure, a light emitting element and a driving element are disposed on different substrates so that a driving current of the light emitting element may be compensated.

According to the present disclosure, a compensation degree may vary depending on how much the stretchable display device is extended so that an image quality may be uniformly maintained.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
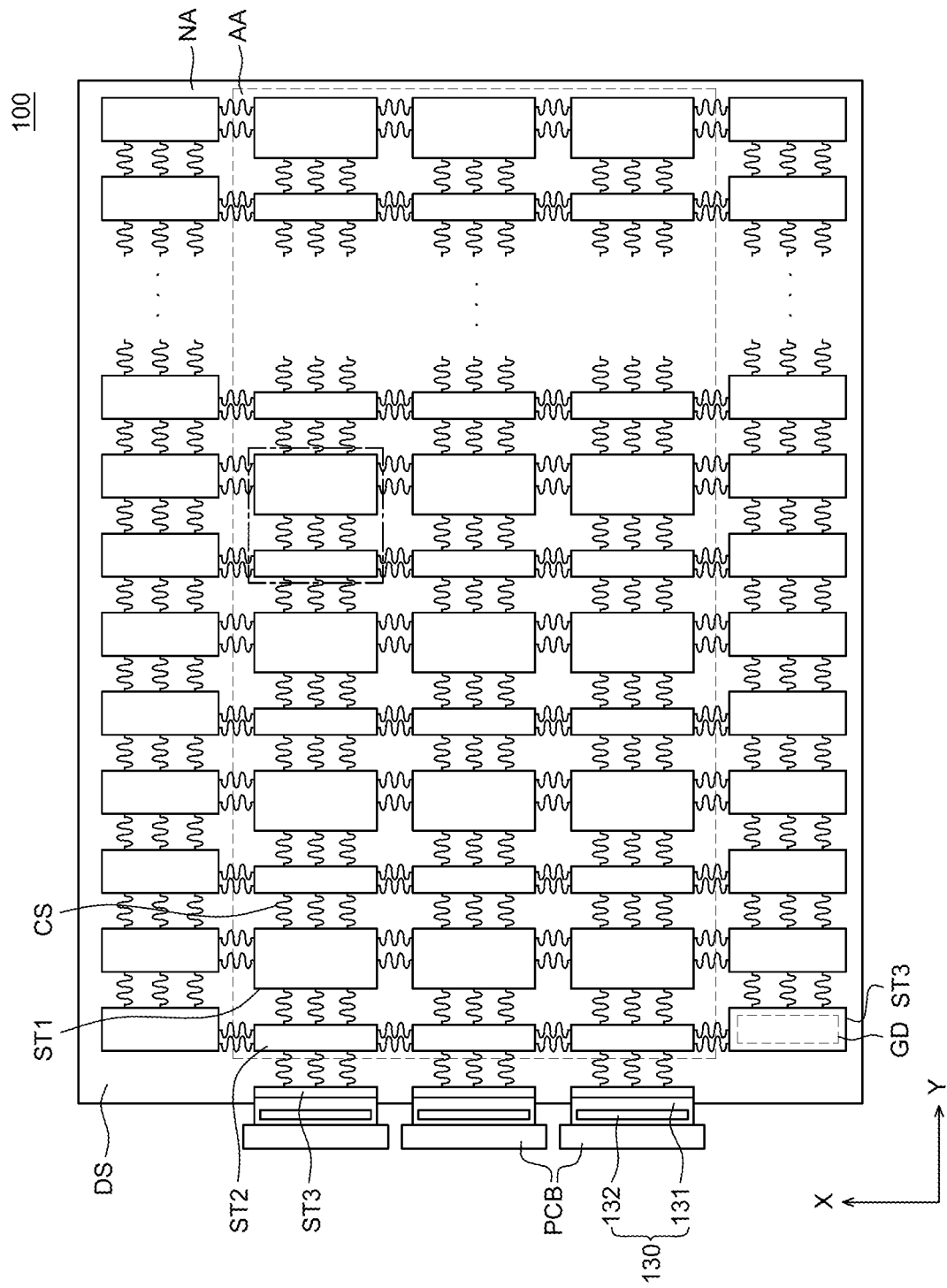
FIG. 1 is a schematic plan view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly."

When an element or layer is disposed "on" another element or layer, other elements or layers may be disposed on the another element or layer or interposed directly therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.

Stretchable Display Device

A stretchable display device may be referred to as a display device which can display images even though the display device is bent or extended. The stretchable display device may have a high flexibility as compared with a general display device of the related art. Therefore, a shape of a stretchable display device may be freely changed in accordance with manipulation of a user to bend or extend a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall. Further, when a force applied by the user is removed, the stretchable display device may return to its original shape.

FIG. 1 is a schematic plan view of a stretchable display device according to an embodiment of the present disclosure.

Referring to FIG. 1, a stretchable display device 100 includes a lower substrate DS, a plurality of first substrates ST1, a plurality of second substrates ST2, a plurality of third substrates ST3, a plurality of connection supports CS, a chip on film (COF) 130, and a printed circuit board PCB.

The lower substrate DS is a substrate which supports and protects various components of the stretchable display device 100 and is referred to as an extension substrate. The lower substrate DS, which is a soft substrate, may be configured by an insulating material which is bendable or extendable. For example, the lower substrate DS may be formed of a silicon rubber such as polydimethylsiloxiane (PDMS) or an elastomer such as polyurethane (PU) or polytetrafluoroethylene (PTFE) and thus have a flexible property. However, the material of the lower substrate DS is not limited thereto.

The lower substrate DS is a soft substrate so as to be reversibly expanded and contracted. Further, an elastic modulus of the lower substrate DS may be several MPa to several hundreds of MPa, for example, may be 0.7 MPa to 1 MPa. Further, a ductile breaking rate of the lower substrate DS may be 100% or higher. Here, the ductile breaking rate refers to an extension distance when an object to be stretched is broken or cracked. That is, the ductile breaking rate is defined as a percentage ratio of a length of an original object and a length of the stretched object when an object has been stretched sufficiently that it is considered broken. For example, if a length of an object (e.g., lower substrate DS) is 100 cm when the object is not stretched and then, it reaches a length of 110 cm when the object has been stretched enough that it becomes broken or cracked at this length, then it has been stretched to 110% of its original length. In this case, the ductile breaking rate of the object is 110%. The number could thus also be called a ductile breaking ratio since it is a ratio of the stretched length as the numerator compared to the original upstretched length as the denominator at the time the break occurs.

The object is considered broken when it cannot longer function properly in the structure or circuit. For example, a wire that is a conductor would be considered broken when there is a sufficient degradation in its ability to carry current that it does not operate within the specifications of the circuit. Thus, in some embodiments, it might not require a full disconnection of the wire for it to be considered broken, a minor stress at a connection ends, a minor crack, a slight shift of the wire's location or other movement that causes it to no longer operate within its expected function would be considered a broken wire. If an insulator is stretched sufficiently that it no longer provides the amount of insulation needed for the structure or circuit, it would be considered broken. Breaking will also include in some embodiments a non-elastic stretching in which the object has been sufficiently stretched that it does not return to its original length and/or shape when it is no longer stretched.

A thickness of the lower substrate DS may be 10 μm to 1 mm but is not limited thereto.

In the meantime, the lower substrate DS may have thereon a display area AA and a non-display area NA enclosing the display area AA. The location of the non-display area NA does not have to necessarily surround or enclose the display area AA. In one or more embodiments, the non-display area NA is adjacent to the display area AA. Various arrangements of the display area AA and the non-display area NA may be contemplated based on the design of the display.

The display area AA is an area in which an image is displayed in the stretchable display device 100 and a light emitting element and various driving elements for driving the light emitting element are disposed in the display area AA. The display area AA may include a plurality of pixels including a plurality of sub-pixels. The plurality of pixels is disposed in the display area AA and includes a plurality of light emitting elements. The plurality of sub-pixels may be connected to various wiring lines, respectively. For example, each of the plurality of sub-pixels may be connected to various wiring lines such as a gate line, a data line, a high potential pixel driving voltage line, a low potential pixel driving voltage line, and a reference voltage line.

The non-display area NA is an area adjacent to the display area AA. The non-display area NA is adjacent to the display area AA to enclose the display area AA. In the non-display area NA, no image is displayed and wiring lines, circuit units, and the like may be formed. For example, in the non-display area NA, a plurality of pads is disposed, and the pads may be connected to the plurality of sub-pixels of the display areas AA, respectively.

The plurality of first substrates ST1, the plurality of second substrates ST2, and the plurality of third substrates ST3 are disposed on the lower substrate DS. The plurality of first substrates ST1 and the plurality of second substrates ST2 may be disposed in the display area AA of the lower substrate DS and the plurality of third substrates ST3 may be disposed in the non-display area NA of the lower substrate DS. Even though in FIG. 1, it is illustrated that the plurality of third substrates ST3 is disposed at an upper side, a lower side, and a left side of the display area AA in the non-display area NA, it is not limited thereto and may be disposed in an arbitrary area of the non-display area NA.

The plurality of first substrates ST1 and the plurality of second substrates ST2 which are disposed in the display area AA may have different sizes. That is, a size of the plurality of first substrates ST1 may be larger than a size of the plurality of second substrates ST2. A light emitting element is disposed on the plurality of first substrates ST1 and a driving element for driving the light emitting element is disposed on the plurality of second substrates ST2. An area where the light emitting element is disposed may be larger than an area where the driving element is disposed. Therefore, the size of the plurality of first substrates ST1 may be larger than the size of the plurality of second substrates ST2.

The plurality of first substrates ST1, the plurality of second substrates ST2, and the plurality of third substrates ST3 are rigid substrates and are spaced apart from each other to be independently disposed on the lower substrate DS. That is, the first substrate ST1 may be referred to as a first rigid substrate, the second substrate ST2 may be referred to as a second rigid substrate, and the third substrate ST3 may be referred to as a third rigid substrate. The plurality of first substrates ST1, the plurality of second substrates ST2, and the plurality of third substrates ST3 may be relatively rigid compared to the lower substrate DS. That is, the lower substrate DS may have flexible characteristics more than the plurality of first substrates ST1, the plurality of second substrates ST2, and the plurality of third substrates ST3 and the plurality of first substrates ST1, the plurality of second substrates ST2, and the plurality of third substrates ST3 have rigid characteristic more than the lower substrate DS.

The plurality of first substrates ST1, the plurality of second substrates ST2, and the plurality of third substrates ST3 which are a plurality of rigid substrates may be formed of a plastic material having flexibility, respectively, and for example, may be formed of polyimide (PI), polyacrylate, or polyacetate but is not limited thereto. However, they are not limited thereto and may be formed of a different material. In this case, the plurality of first substrates ST1, the plurality of second substrates ST2, and the plurality of third substrates ST3 may be formed of the same material but are not limited thereto and may be formed of different materials.

Moduli of the plurality of first substrates ST1, the plurality of second substrates ST2, and the plurality of third substrates ST3 may be higher than that of the lower substrate DS. The modulus is an elastic modulus which represents a ratio of deformation by a stress with respect to the stress applied to the substrate. The higher the modulus, the higher a degree of hardness. Accordingly, the plurality of first substrates ST1, the plurality of second substrates ST2, and the plurality of third substrates ST3 may be a plurality of rigid substrates which has a higher rigidity than the lower substrate DS. The moduli of the plurality of first substrates ST1, the plurality of second substrates ST2, and the plurality of third substrates ST3 may be 1000 times or higher than the modulus of the lower substrate DS but are not limited thereto. For example, elastic moduli of the plurality of first substrates ST1, the plurality of second substrates ST2, and the plurality of third substrates ST3 may be 2 GPa to 9 GPa depending on a transparency. More specifically, when the plurality of first substrates ST1, the plurality of second substrates ST2, and the plurality of third substrates ST3 are transparent, the elastic modulus is 2 GPa and when the pixel substrate 111 is opaque, the elastic modulus is 9 GPa.

In some embodiments, the lower substrate DS may be defined to include a plurality of first lower patterns and a second lower pattern. The plurality of first lower patterns is disposed in an area of the lower substrate DS overlapping with the plurality of first substrates ST1, the plurality of second substrates ST2, and the plurality of third substrates ST3. The second lower pattern may be disposed in an area excluding an area where the plurality of first substrates ST1, the plurality of second substrates ST2, and the plurality of third substrates ST3 are disposed or may be disposed in the entire stretchable display device 100.

In this case, moduli of the plurality of first lower patterns may be higher than modulus of the second lower pattern. For example, the plurality of first lower patterns may be formed of the same material as the plurality of first substrates ST1 and the second lower pattern may be formed of a material having a modulus lower than that of the plurality of first substrates ST1.

The COF 130 is a flexible film on which various components are disposed on a base film 141 having a malleability and supplies signals to the plurality of sub-pixels of the display area AA. The COF 130 may be bonded to the plurality of pads disposed in the non-display area NA and supply a data signal, etc. to the plurality of sub-pixels of the display area AA through the pads. The COF 130 includes the base film 141 and a driving IC 142. Further, various components may be additionally disposed thereon.

The base film 141 is a layer which supports the driving IC 142 of the COF 130. The base film 141 may be formed of an insulating material, and for example, may be formed of an insulating material having a flexibility.

The driving IC 142 is a component which processes data for displaying images and a driving signal for processing the data. In FIG. 1, even though it is illustrated that the driving IC 142 is mounted by the COF 130 technique, it is not limited thereto and the driving IC 142 may be mounted by chip on glass (COG), tape carrier package (TCP), or the like.

In FIG. 1, one third substrate ST3 is disposed in the non-display area NA at one side of the display area AA so as to correspond to the first substrates ST1 in one column and the second substrates ST2 in the other column disposed in the display area AA and one COF 130 is disposed on one third substrate ST3 but is not limited thereto. That is, one third substrate ST3 and one COF 130 may be disposed so as to correspond to a plurality of columns of the first substrates ST1 or a plurality of columns of the second substrates ST2.

A control unit such as an IC chip, a circuit unit, or the like may be mounted on the printed circuit board PCB. Further, on the printed circuit board PCB, a memory, a processor, or the like may also be mounted. The printed circuit board PCB is a component which transmits a signal for driving the light emitting element from the control unit to the light emitting element. Even though in FIG. 1, it is described that three printed circuit boards PCB are used, the number of printed circuit boards PCB is not limited thereto.

Hereinafter, the stretchable display device 100 according to the embodiment of the present disclosure will be described in more detail with reference to FIGS. 2 and 3.

Planar and Cross-Sectional Structures

Figure 2:
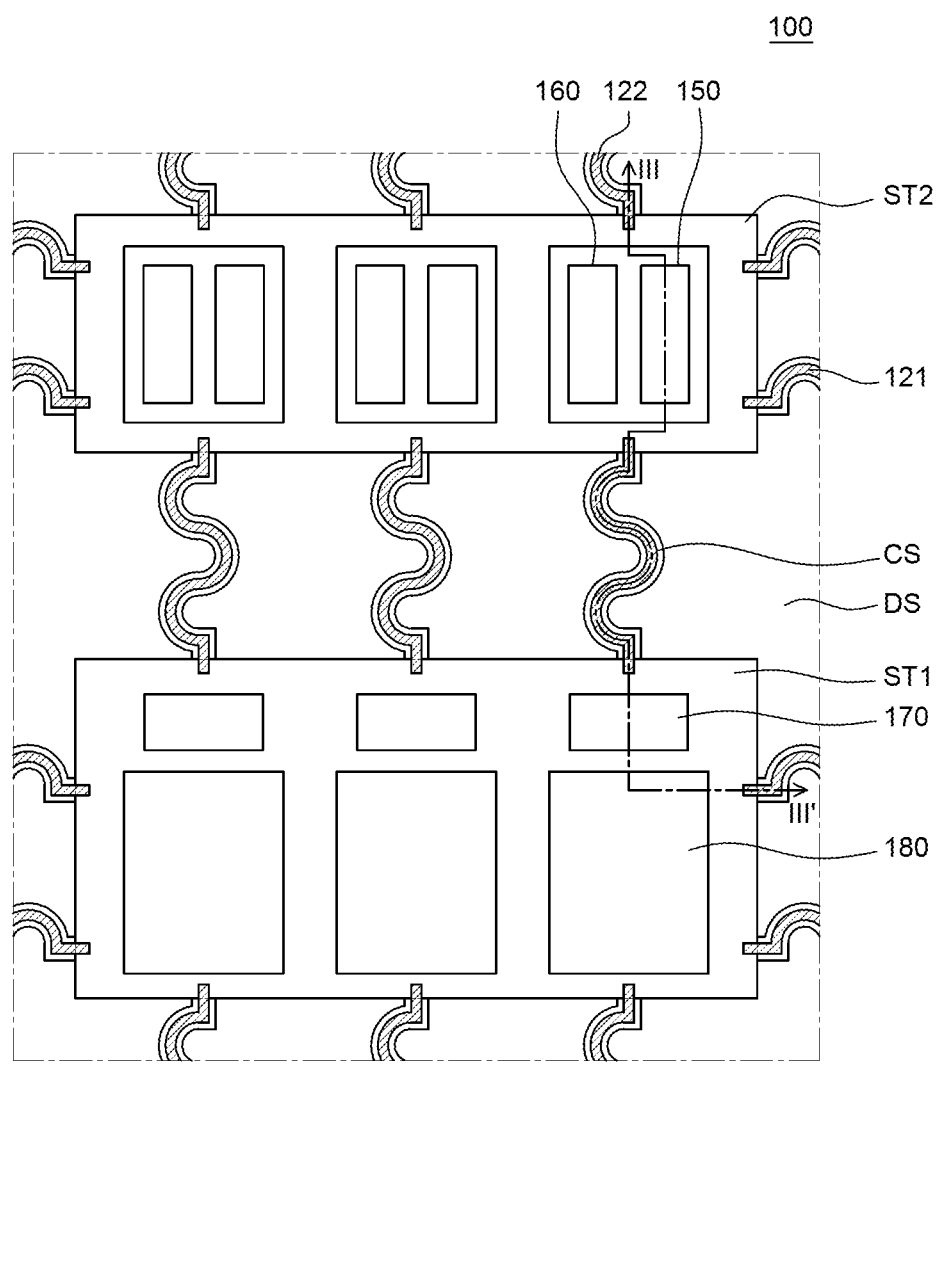
FIG. 2 is an enlarged plan view of a stretchable display device according to an embodiment of the present disclosure.

FIG. 2 is an enlarged plan view of a stretchable display device according to an embodiment of the present disclosure. FIG. 3 is a cross-sectional view taken along the line III-III' of FIG. 2. For the convenience of description, the stretchable display device 100 according to the embodiment of the present disclosure will be described with reference to FIG. 1 together.

Figure 3:
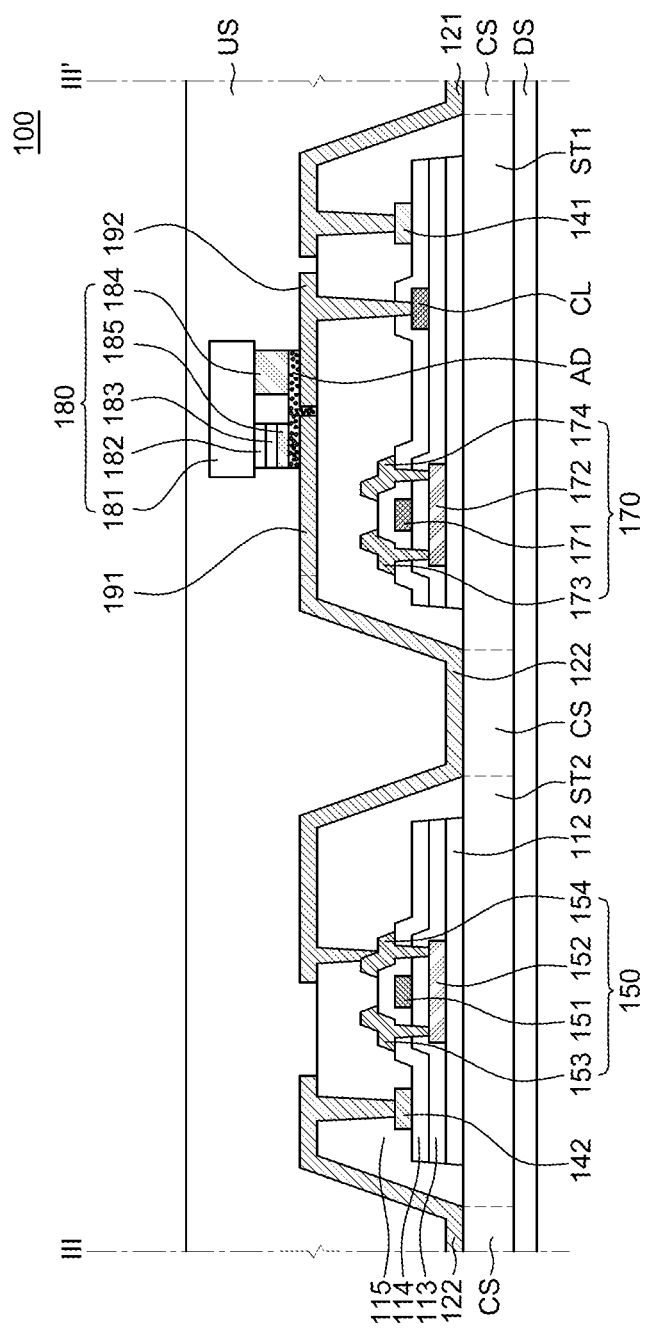
FIG. 3 is a cross-sectional view taken along the line III-III' of FIG. 2.

Referring to FIGS. 2 and 3, the stretchable display device 100 includes a lower substrate DS, a plurality of first substrates ST1, a plurality of second substrates ST2, a plurality of third substrates ST3, a plurality of connection supports CS, a plurality of connection lines (e.g., at least a first connection line 121, at least a second connection line 122, or the like), a plurality of pads (e.g., a first pad 141, a second pad 142, or the like), a driving transistor 150, a switching transistor 160, a compensation transistor 170, and an LED 180.

Referring to FIGS. 1 and 2, the plurality of first substrates ST1 and the plurality of second substrates ST2 are disposed on the lower substrate DS in the display area AA. The plurality of first substrates ST1 and the plurality of second substrates ST2 are alternately disposed on the lower substrate DS. For example, as illustrated in FIGS. 1 and 2, on the lower substrate DS, a plurality of first substrates ST1 is disposed in one column and a plurality of second substrates ST2 is disposed in a next column and this arrangement may be repeated. However, the present disclosure is not limited thereto, and depending on the design, the first substrates ST1 and the second substrates ST2 may be disposed in various forms to be adjacent.

Referring to FIGS. 1 and 2, the LED 180 which is a light emitting element and a compensation transistor 170 which is a compensation element may be disposed on the plurality of first substrates ST1. A driving transistor 150 and a switching transistor 160 which are driving elements may be disposed on the plurality of second substrates ST2. Further, a gate driver GD may be mounted in a third substrate ST3 which is located at a left side of the display area AA, among the plurality of third substrates ST3. The gate driver GD may be formed on the third substrate ST3 in a gate in panel (GIP) manner when various components on the first substrate ST1 and the second substrate ST2 are manufactured. Therefore, various circuit configurations which configure the gate driver GD, such as various transistors, capacitors, and wiring lines, may be disposed on the plurality of third substrates ST3. However, it is not limited thereto and the gate driver GD may be mounted in a chip on film (COF) manner. Further, the plurality of third substrates ST3 may also be disposed in the non-display area NA located at a right side of the display area AA and the gate driver GD may also be mounted in the plurality of third substrates ST3 located at the right side of the display area AA.

Referring to FIG. 1, sizes of the plurality of third substrates ST3 may be larger than sizes of the plurality of second substrates ST2. Specifically, a size of each of the plurality of third substrates ST3 may be larger than a size of each of the plurality of second substrates ST2. As described above, on each of the plurality of third substrates ST3, the gate driver GD is disposed. For example, one stage of the gate driver GD may be disposed on each of the plurality of third substrates ST3. Therefore, an area occupied by various circuit configurations which configure one stage of the gate driver GD may be relatively larger than an area occupied by the driving transistor 150 and the switching transistor 160 which are driving elements. As a result, a size of each of the plurality of third substrates ST3 may be larger than a size of each of the plurality of second substrates ST2.

Referring to FIGS. 1 and 2, the plurality of connection supports CS may be disposed between the plurality of first substrates ST1, between the plurality of second substrates ST2, between the plurality of third substrates ST3, or between the plurality of first substrates ST1, the plurality of second substrates ST2, and the plurality of third substrates ST3. The plurality of connection supports CS may be substrates which connect adjacent first substrates ST1, adjacent second substrates ST2, adjacent third substrates ST3, or the first substrates ST1, the second substrates ST2, and the third substrates ST3 which are adjacent to each other. That is, the plurality of connection supports may be connection substrates which connect the first substrate ST1 and the third substrate ST3, connect the first substrate ST1 and the second substrate ST2, or connect the second substrate ST2 and the third substrate ST3. The plurality of connection supports CS may be simultaneously and integrally formed with the same material as the first substrate ST1, the second substrate ST2, and the third substrate ST3, but is not limited thereto.

Referring to FIG. 2, the plurality of connection supports CS has a wavy shape on a flat surface. For example, as illustrated in FIG. 2, the plurality of connection supports CS may have a sine wave shape. However, the shape of the plurality of connection supports CS is not limited thereto and for example, the plurality of connection supports CS may extend with a zigzag pattern or may be formed with various shapes such as a shape extended by connecting a plurality of rhombus-shaped substrates at vertexes. Further, the number and the shape of the plurality of connection supports CS illustrated in FIG. 2 are illustrative and the number and the shape of the plurality of connection supports CS may vary depending on the design.

Referring to FIG. 3, a buffer layer 112 is disposed on the plurality of first substrates ST1 and the plurality of second substrates ST2. The buffer layer 112 is formed on the plurality of first substrates ST1 and the plurality of second substrates ST2 to protect various components of the stretchable display device 100 from permeation of moisture $H_2O$ and oxygen $O_2$ from the outside of the lower substrate DS and the plurality of first substrates ST1. The buffer layer 112 may be configured by an insulating material and for example, configured by a single layer or a double layer of an inorganic layer formed of silicon nitride (SiNx), silicon oxide (SiOx), silicon oxynitride (SiON), and the like. However, the buffer layer 112 may be omitted depending on a structure or a characteristic of the stretchable display device 100.

The buffer layer 112 may be formed only in an area where the lower substrate DS overlaps with the plurality of first substrates ST1, the plurality of second substrates ST2, and the plurality of third substrates ST3. As described above, the buffer layer 112 may be formed of an inorganic material so that the buffer layer 112 may be easily cracked or damaged during a process of extending the stretchable display device 100. In this case, the buffer layer 112 is not formed in an area between the plurality of first substrates ST1, the plurality of second substrates ST2, and the plurality of third substrates ST3, but is patterned to have a shape of the plurality of first substrates ST1, the plurality of second substrates ST2, and the plurality of third substrates ST3 to be disposed only above the plurality of first substrates ST1, the plurality of second substrates ST2, and the plurality of third substrates ST3. In other words, the buffer layer 112 may not be formed on the plurality of connection supports CS. Therefore, in the stretchable display device 100 according to the embodiment of the present disclosure, the buffer layer 112 is formed only in an area overlapping with the plurality of first substrates ST1, the plurality of second substrates ST2, and the plurality of third substrates ST3 which are rigid substrates. Therefore, even though the stretchable display device 100 is bent or extended to be deformed, the damage of the buffer layer 112 may be suppressed.

Referring to FIG. 3, the compensation transistor 170 is disposed above the buffer layer 112 disposed on the first substrate ST1 and the switching transistor 160 and the driving transistor 150 are formed above the buffer layer 112 disposed on the second substrate ST2.

Even though in FIG. 3, a specific arrangement of the switching transistor 160 is not illustrated, the switching transistor 160 may be formed on the same layer as the driving transistor 150.

First, referring to FIG. 3, an active layer 152 of the driving transistor 150 and an active layer 172 of the compensation transistor 170 are disposed on the buffer layer 112. For example, the active layer 152 of the driving transistor 150 and the active layer 172 of the compensation transistor 170 may be formed of an oxide semiconductor, amorphous silicon (a-Si), polycrystalline silicon (poly-Si), or an organic semiconductor, respectively.

A gate insulating layer 113 is disposed on the active layer 152 of the driving transistor 150 and the active layer 172 of the compensation transistor 170. The gate insulating layer 113 is a layer which electrically insulates the gate electrode 151 of the driving transistor 150 and the gate electrode 171 of the compensation transistor 170 from the active layer 152 of the driving transistor 150 and the active layer 172 of the compensation transistor 170 and may be formed of an insulating material. For example, the gate insulating layer 113 may be formed as a single layer of silicon nitride (SiNx) or silicon oxide (SiOx) which is an inorganic material or a multi-layer of silicon nitride (SiNx) or silicon oxide (SiOx), but it is not limited thereto.

A gate electrode 151 of the driving transistor 150 and a gate electrode 171 of the compensation transistor 170 are disposed on the gate insulating layer 113. The gate electrode 151 of the driving transistor 150 is disposed to overlap with the active layer 152 of the driving transistor 150. Further, the gate electrode 171 of the compensation transistor 170 is also disposed to overlap with the active layer 172 of the compensation transistor 170. The gate electrode 151 of the driving transistor 150 and the gate electrode 171 of the compensation transistor 170 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 114 is disposed on the gate electrode 151 of the driving transistor 150 and the gate electrode 171 of the compensation transistor 170. The interlayer insulating layer 114 is a layer which insulates the gate electrode 151 of the driving transistor 150 from the source electrode 153 and the drain electrode 154 and insulates the gate electrode 171 of the compensation transistor 170 from the source electrode 173 and the drain electrode 174. Similarly to the buffer layer 112, the interlayer insulating layer may be formed of an inorganic material. For example, the interlayer insulating layer 114 may be configured by a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 of the driving transistor 150 which are in contact with the active layer 152 of the driving transistor 150 are disposed on the interlayer insulating layer 114. The source electrode 173 and the drain electrode 174 of the compensation transistor 170 which are in contact with the active layer 172 of the compensation transistor 170, respectively, are disposed on the interlayer insulating layer 114. The source electrode 153 and the drain electrode 154 are disposed on the same layer to be spaced apart from each other. The source electrode 153 and the drain electrode 154 of the driving transistor 150 may be in contact with the active layer 152 of the driving transistor 150 to be electrically connected to the active layer 152 of the driving transistor 150. As described above, the source electrode 173 and the drain electrode 174 of the compensation transistor 170 may be in contact with the active layer 172 of the compensation transistor 170 to be electrically connected to the active layer 172 of the compensation transistor 170. The source electrodes 153 and 173 and the drain electrodes 154 and 174 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

The gate insulating layer 113 and the interlayer insulating layer 114 are patterned to be formed only in an area overlapping with the plurality of first substrates ST1 and the plurality of second substrates ST2. The gate insulating layer 113 and the interlayer insulating layer 114 are also formed of the inorganic material, similarly to the buffer layer 112, so that the gate insulating layer 113 and the interlayer insulating layer 114 may also be easily cracked to be damaged during the process of extending the stretchable display device 100. In this case, the gate insulating layer 113 and the interlayer insulating layer 114 are not formed in an area between the plurality of first substrates ST1 and the plurality of second substrates ST2. In contrast, the gate insulating layer 113 and the interlayer insulating layer 114 are patterned to have a shape of the plurality of first substrates ST1 and the plurality of second substrates ST2 to be disposed only above the plurality of first substrates ST1 and the plurality of second substrates ST2.

In FIG. 3, even though among various transistors which may be included in the stretchable display device 100, only a driving transistor is illustrated for the convenience of description, a switching transistor or a capacitor may also be included in the display device. Further, in this specification, even though it is described that the transistor 150 has a coplanar structure, various transistors of such as a staggered structure may also be used.

Referring to FIG. 3, a plurality of pads is disposed on the interlayer insulating layer 114. In the drawing, even though it is illustrated that the plurality of pads is disposed on the first substrates ST1 and the plurality of second substrates ST2, the plurality of pads may also be disposed on the third substrates ST3. The plurality of pads may be pads which transmit any one of various signals such as a scan signal, a data signal, an emission signal, a high potential power signal, a low potential power signal, a reference voltage signal, and a compensation signal to the light emitting element or the driving element, but is not limited thereto. The plurality of pads may be formed of the same material as the source electrodes 153 and 173 and the drain electrodes 154 and 174, but is not limited thereto.

The plurality of pads includes a first pad 141 and a second pad 142. The first pad 141 may be connected to a first connection line 121. The second pad 142 may be connected to a second connection line 122.

Referring to FIG. 3, the planarization layer 115 is formed on the driving transistor 150 and the interlayer insulating layer 114 and the planarization layer 115 is formed on the compensation transistor 170 and the interlayer insulating layer 114. The planarization layer 115 planarizes upper portions of the driving transistor 150 and the compensation transistor 170. The planarization layer 115 may be configured by a single layer or a plurality of layers and may be formed of an organic material. Therefore, the planarization layer 115 may also be referred to as an organic insulating layer. For example, the planarization layer 115 may be formed of an acrylic organic material, but is not limited thereto.

Referring to FIG. 3, the planarization layer 115 is disposed on the plurality of first substrates ST1 and the plurality of second substrates ST2 to cover top surfaces and side surfaces of the buffer layer 112, the gate insulating layer 113, and the interlayer insulating layer 114. By doing this, the planarization layer 115 encloses the buffer layer 112, the gate insulating layer 113, and the interlayer insulating layer 114 together with the plurality of first substrates ST1 and the plurality of second substrates ST2. Specifically, the planarization layer 115 may be disposed so as to cover a top surface and a side surface of the interlayer insulating layer 114, a side surface of the gate insulating layer 113, a side surface of the buffer layer 112, and parts of top surfaces of the plurality of first substrates ST1 and the plurality of second substrates ST2.

The planarization layer 115 may supplement a step on the side surfaces of the buffer layer 112, the gate insulating layer 113, and the interlayer insulating layer 114 and enhance an adhesive strength of the planarization layer 115 and the connection line disposed on the side surface of the planarization layer 115. For example, the side surface of the planarization layer 115 may have a slope which is gentler than a slope formed by a side surface of the interlayer insulating layer 114, a side surface of the gate insulating layer 113, and a side surface of the buffer layer 112. Therefore, the connection line which is disposed to be in contact with the side surface of the planarization layer 115 is disposed with a gentle slope so that when the stretchable display device 100 is extended, a stress generated in the connection line is reduced. Further, the crack occurring in the connection line or a separation from the side surface of the planarization layer 115 may be suppressed.

In some embodiments, a passivation layer may be formed between the transistor 150 and the planarization layer 115. That is, the passivation layer may be formed to cover the transistor 150 to protect the transistor 150 from the permeation of the moisture and oxygen. The passivation layer may be formed of an inorganic material and configured by a single layer or a plurality of layer, but is not limited thereto.

Referring to FIG. 3, a common line CL is disposed on the gate insulating layer 113 which is disposed on the first substrate ST1. The common line CL is a wiring line which applies a common voltage to the LED 180. The common line CL may be formed of the same material as the gate electrode 151 of the driving transistor 150 and the gate electrode 171 of the compensation transistor 170, but is not limited thereto.

Referring to FIG. 3, a first connection pad 191 and a second connection pad 192 are disposed on the planarization layer 115. The first connection pad 191 is an electrode which electrically connects an LED 180 to be described below and the driving transistor 150. For example, the first connection pad 191 may electrically connect the drain electrode 154 of the driving transistor 150 and the LED 180 through the second connection line 122.

The second connection pad 192 is an electrode which electrically connects the LED 180 and the common line CL. For example, the second connection pad 192 may electrically connect the common line CL and the LED 180 through the contact hole formed in the planarization layer 115.

Referring to FIG. 3, the LED 180 is disposed on the first connection pad 191 and the second connection pad 192. The LED 180 includes an n-type layer 181, an active layer 182, a p-type layer 183, an n-electrode 184, and a p-electrode 185. The LED 180 of the stretchable display device 100 according to the embodiment of the present disclosure has a flip-chip structure in which the n-electrode 184 and the p-electrode 185 are formed on one surface.

The n-type layer 181 may be formed by injecting an n-type impurity into gallium nitride (GaN). The n-type layer 181 may be disposed on a separate base substrate which is formed of a material which is capable of emitting light.

The active layer 182 is disposed on the n-type layer 181. The active layer 182 is a light emitting layer which emits light in the LED 180 and may be formed of a nitride semiconductor, for example, indium gallium nitride (InGaN). The p-type layer 183 is disposed on the active layer 182. The p-type layer 183 may be formed by injecting a p-type impurity into gallium nitride (GaN).

As described above, the LED 180 according to the embodiment of the present disclosure may be manufactured by sequentially laminating the n-type layer 181, the active layer 182, and the p-type layer 183, and then etching a predetermined part to form the n-electrode 184 and the p-electrode 185. In this case, the predetermined part which is a space for separating the n-electrode 184 and the p-electrode 185 from each other may be etched to expose a part of the n-type layer 181. In other words, the surfaces of the LED 180 on which the n-electrode 184 and the p-electrode 185 are disposed are not flat surfaces but have different heights.

As described above, in the etched area, in other words, on the n-type layer 181 exposed by the etching process, the n-electrode 184 is disposed. The n-electrode 184 may be formed of a conductive material. In the meantime, in an area which is not etched, in other words, on the p-type layer 183, the p-electrode 185 is disposed. The p-electrode 185 is also formed of a conductive material, and for example, may be formed of the same material as the n-electrode 184.

An adhesive layer AD is disposed on top surfaces of the first connection pad 191 and the second connection pad 192 and between the first connection pad 191 and the second connection pad 192 so that the LED 180 may be bonded onto the first connection pad 191 and the second connection pad 192. In this case, the n-electrode 184 may be disposed on the second connection pad 192 and the p-electrode 185 may be disposed on the first connection pad 191.

The adhesive layer AD may be a conductive adhesive layer in which conductive balls are dispersed in an insulating base member. Therefore, when heat or pressure is applied to the adhesive layer AD, the conductive balls are electrically connected in a portion applied with heat or pressure to have a conductive property and an area which is not pressurized may have an insulating property. For example, the n-electrode 184 is electrically connected to the second connection pad 192 by means of the adhesive layer AD and the p-electrode 185 is electrically connected to the first connection pad 191 by means of the adhesive layer AD. That is, after applying the adhesive layer AD on the first connection pad 191 and the second connection pad 192 using an inkjet method, the LED 180 is transferred onto the adhesive layer AD and the LED 180 is pressurized and heated. By doing this, the first connection pad 191 is electrically connected to the p-electrode 185 and the second connection pad 192 is electrically connected to the n-electrode 184. However, the remaining part of the adhesive layer AD excluding a part of the adhesive layer AD disposed between the n-electrode 184 and the second connection pad 192 and a part of the adhesive layer AD disposed between the p-electrode 185 and the first connection pad 191 has an insulating property.

In the meantime, the adhesive layer AD may be divided to be disposed on the first connection pad 191 and the second connection pad 192, respectively. That is, the adhesive layer AD disposed between the p-electrode 185 and the first connection pad 191 may be defined as a first adhesive pattern and the adhesive layer AD disposed between the n-electrode 184 and the second connection pad 192 may be defined as a second adhesive pattern.

With the above-described structure, when the stretchable display device 100 according to the embodiment of the present disclosure is turned on, different voltage levels which are applied to the first connection pad 191 and the second connection pad 192 are transmitted to the n-electrode 184 and the p-electrode 185. By doing this, the LED 180 emits light.

In the meantime, even though in FIG. 3, it is illustrated that a bank is not used, the bank may be formed on the first connection pad 191, the second connection pad 192, the connection line, and the planarization layer 115. The bank may divide sub-pixels which are disposed on one side and the other side of the LED 180 to be adjacent to each other. The bank may be formed of an insulating material. Further, the bank may include a black material. The bank includes the black material to block wiring lines which may be visible through the display area AA. For example, the bank may be formed of a transparent carbon-based mixture and specifically, include carbon black. However, it is not limited thereto and the bank may be formed of a transparent insulating material.

Referring to FIGS. 1 and 3, the upper substrate US is disposed on the LED 180 and the lower substrate DS. The upper substrate US is a substrate which supports various components disposed below the upper substrate US. Specifically, the upper substrate US is formed by coating a material which configures the upper substrate US on the lower substrate DS and then curing the material to be disposed to be in contact with the lower substrate DS, the first substrate ST1, the second substrate ST2, the third substrate ST3, and the connection supports CS.

The upper substrate US, which is a flexible substrate, may be configured by an insulating material which is bendable or extendable. The upper substrate US is a flexible substrate so as to be reversibly expanded and contracted. Further, an elastic modulus of the upper substrate may be several MPa to several hundreds of MPa and a ductile breaking ratio may be 100% or higher. A thickness of the upper substrate US may be 10 µm to 1 mm but is not limited thereto.

The upper substrate US may be formed of the same material as the lower substrate DS. For example, the upper substrate US may be formed of a silicon rubber such as polydimethylsiloxiane (PDMS) or an elastomer such as polyurethane (PU) or polytetrafluoroethylene (PTFE) and thus have a flexible property. However, the material of the upper substrate US is not limited thereto.

Even though not illustrated in FIG. 3, a polarization layer may be disposed on the upper substrate US. The polarization layer may perform a function which polarizes light incident from the outside of the stretchable display device 100 to reduce the external light reflection. Further, an optical film other than the polarization layer may be disposed on the upper substrate US.

Referring to FIGS. 2 and 3, the plurality of connection lines is disposed on the planarization layer 115 and the plurality of connection supports CS. The plurality of connection lines refers to wiring lines which electrically connect a plurality of pads which is adjacent to each other. In this case, the connection line and the pad may be electrically connected to each other through a contact hole formed in the planarization layer 115. The plurality of connection lines may be configured by one of various wiring lines such as a gate line, a data line, an emission signal line, a high potential power line, a low potential power line, a reference voltage line, and a compensation signal line, but is not limited thereto.

The plurality of connection lines is disposed between the first substrate ST1, the second substrate ST2, and the third substrate ST3 which are adjacent to each other to electrically connect the components disposed on the first substrate ST1, the second substrate ST2, and the third substrate ST3 which are adjacent to each other. Specifically, the plurality of connection lines may be disposed on an exterior surface of the connection support CS which connects the first substrate ST1, the second substrate ST2, and the third substrate ST3 which are adjacent to each other.

In an area corresponding to the connection support CS, the plurality of connection lines is formed to have the same shape as the plurality of connection supports CS to overlap with each other. That is, the plurality of connection lines may have the same wavy shape as the plurality of connection supports CS above the plurality of connection supports CS.

The plurality of connection lines includes the first connection line 121 and the second connection line 122. The first connection line 121 and the second connection line 122 may be disposed between the plurality of first substrates ST1, the plurality of second substrates ST2, and the plurality of third substrates ST3.

The first connection line 121 may be formed to extend to an exterior surface of the connection support CS while being in contact with a top surface and a side surface of the planarization layer 115 disposed on the first substrate ST1 and the second substrate ST2. The second connection line 122 may also be formed to extend to the exterior surface of the connection support CS while being in contact with the top surface and the side surface of the planarization layer 115 disposed on the first substrate ST1 and the plurality of second substrates ST2.

In FIGS. 1 and 2, the first connection line 121 refers to a wiring line extending in an X-axis direction among the plurality of connection lines, and the second connection line 122 refers to a wiring line extending in a Y-axis direction among the plurality of connection lines. The first connection line 121 and the second connection line 122 may be configured to transmit different signals to the light emitting element and the driving element. That is, a signal transmitted by the first connection line 121 may be different from a signal transmitted by the second connection line 122.

The plurality of connection lines may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

The display device includes various signal lines such as a gate line, a data line, an emission signal line, a high potential power line, a low potential power line, a reference voltage line, or a compensation signal line. In the case of a general display device, various signal lines are disposed to extend as a straight line between the plurality of sub-pixels and the plurality of sub-pixels is connected to one signal line. Therefore, in the general display device, various signal lines may extend from one side of the display device to the other side without being disconnected on the substrate.

In contrast, in the case of the stretchable display device 100 according to the embodiment of the present disclosure, a straight signal line which is considered to be used for the general display device is disposed only on the plurality of first substrates ST1, the plurality of second substrates ST2, and the plurality of third substrates ST3. That is, in the stretchable display device 100 according to the embodiment of the present disclosure, a straight signal line may be disposed only on the plurality of first substrates ST1, the plurality of second substrates ST2, and the plurality of third substrates ST3.

In the stretchable display device 100 according to the embodiment of the present disclosure, in order to connect discontinuous wiring lines on the first substrate ST1, the second substrate ST2, or the third substrate ST3, the pads on the adjacent substrates ST1, ST2, and ST3 may be connected by the connection lines. That is, the connection line electrically connects the pads on the first substrate ST1, the second substrate ST2, and the third substrate ST3. Therefore, in the stretchable display device 100 according to the embodiment of the present disclosure, straight signal lines on the plurality of first substrates ST1, the plurality of second substrates ST2, and the plurality of third substrates ST3 may be electrically connected to each other by the plurality of connection lines.

For example, the gate line may be disposed on the plurality of first substrates ST1 and the plurality of second substrates ST2 disposed to be adjacent to each other in the X-axis direction and the gate pad may be disposed on both ends of the gate line. For example, the first pad 141 may be one of gate pads disposed on both ends of the gate line. The first connection line 121 may serve as a gate line. The first pads 141 on the plurality of first substrates ST1 and the plurality of second substrates ST2 which are adjacent to each other in the X-axis direction may be connected to each other by the first connection line 121 on the connection support CS. Therefore, the gate line disposed on the plurality of first substrates ST1 and the plurality of second substrates ST2 and the first connection line 121 disposed on the connection support CS may serve as one gate line. Therefore, one gate signal may be transmitted to the gate electrode 151 of the driving transistor 150 and the gate electrode 171 of the compensation transistor 170 through the first pad 141, the first connection line 121, and the gate lines disposed on the plurality of first substrates ST1 and the plurality of second substrates ST2.

Alternatively, the first connection line 121 may also serve as a common line CL which applies a high potential common voltage and a low potential common voltage. Therefore, the high potential common voltage and the low potential common voltage may be supplied to the driving element and the light emitting element disposed on the plurality of first substrates ST1 and the plurality of second substrates ST2.

Further, the data line is disposed on the plurality of second substrates ST2 disposed to be adjacent to each other in the Y-axis direction and a data pad may be disposed on both ends of the data line. For example, the second pad 142 may be one of data pads disposed on both ends of the data line. The second connection line 122 may serve as a data line. The second pad 142 on the plurality of second substrates ST2 which are adjacent to each other in the Y-axis direction and another pad may be connected to each other by the second connection line 122 on the connection support CS. Therefore, the data line disposed on the plurality of second substrates ST2 and the second connection line 122 disposed on the connection support CS may serve as one data line. Further, the second connection line 122 may connect the drain electrode 154 of the driving transistor 150 disposed on the second substrate ST2 and the first connection pad 191 formed on the second substrate ST2. By doing this, a driving current output through the drain electrode 154 of the driving transistor 150 may flow into the LED 180 through the second connection line 122.

Further, the connection line may further include a wiring line which connects pads on the plurality of first substrates ST1, the plurality of second substrates ST2, and the plurality of third substrates ST3 to each other or connects pads on two third substrates ST3 which are disposed to be parallel, among pads on the plurality of third substrates ST3 adjacent in the Y-axis direction.

Change of Capacitance of Compensation Capacitor

Figure 4:
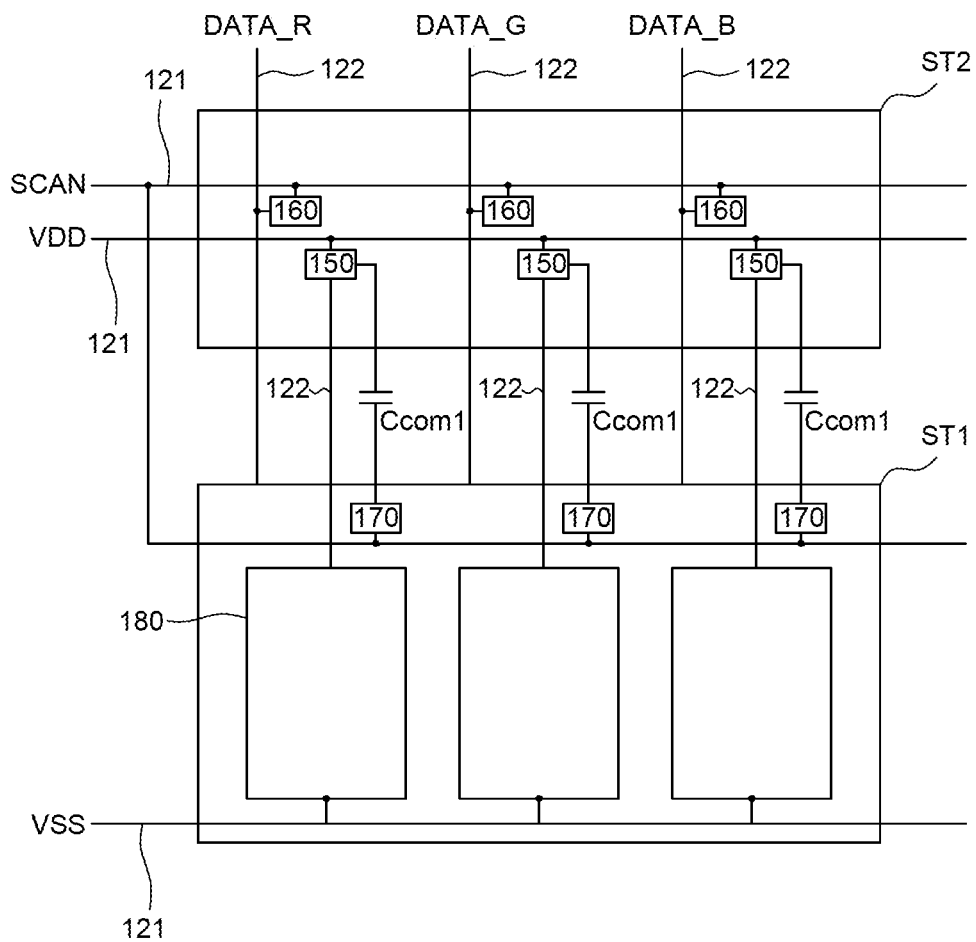
FIG. 4 is a block diagram of a stretchable display device according to an embodiment of the present disclosure.

FIG. 4 is a block diagram of a stretchable display device according to an embodiment of the present disclosure.

Referring to FIG. 4, the LED 180 which is a light emitting element and the compensation transistor 170 are disposed on the first substrate ST1 and the switching transistor 160 and the driving transistor 150 are disposed on the second substrate ST2.

The scan signal SCAN is applied to the switching transistor 160 and the compensation transistor 170 through the first connection line 121. The high potential common voltage VDD is applied to the driving transistor 150 through the first connection line 121 and the low potential common voltage VSS is applied to the LED 180 through the first connection line 121. Data signals DATA_R, DATA_G, and DATA_B are applied to the switching transistor 160.

Specifically, the scan signal SCAN, the high potential common voltage VDD, and the low potential common voltage VSS which are applied through the first connection line 121 are commonly applied to all sub-pixels. However, the data signals DATA_R, DATA_G, DATA_B which are applied through the second connection line 122 are individually applied to the sub-pixels. That is, the data signals may be a red data signal DATA_R which is applied to a switching transistor 160 of a first sub-pixel, a green data signal DATA_G which is applied to a switching transistor 160 of a second sub-pixel, and a blue data signal DATA_B which is applied to a switching transistor 160 of a third sub-pixel. However, the order of the data signals DATA_R, DATA_G, DATA_B is not limited thereto and may vary depending on the various designs.

The compensation transistor 170 formed on the first substrate ST1 and the driving transistor 150 formed on the second substrate ST2 are spaced apart from each other so that a compensation capacitor Ccom1 may be formed between the compensation transistor 170 and the driving transistor 150. As described above, the first substrate ST1 and the second substrate ST2 are spaced apart from each other so that when the stretchable display device is extended, the distance between the first substrate ST1 and the second substrate ST2 may be increased. Therefore, the distance between the compensation transistor 170 formed on the first substrate ST1 and the driving transistor 150 formed on the second substrate ST2 is also increased.

$$\Delta Ccom = \frac{A}{\Delta d} \quad \text{[Equation 1]}$$

Here, ΔCcom is a change of a capacitance of the compensation capacitor Ccom1, Δd is a change of a distance between the compensation transistor 170 and the driving transistor 150, and A is an overlapping area between the compensation transistor 170 and the driving transistor 150.

According to Equation 1, it is confirmed that as the distance between the compensation transistor 170 formed on the first substrate ST1 and the driving transistor 150 formed on the second substrate ST2 is increased, the capacitance of the compensation capacitor Ccom1 is reduced.

For example, as shown in FIG. 4, the first substrate ST1 is adjacently located to the second substrate ST2. As the distance between the first substrate ST1 and the second substrate ST2 is increased (or the distance between the first substrate ST1 and the second substrate ST2 becomes longer), a change of a capacitance of the compensation capacitor Ccom1 is decreased (or the change of a capacitance of the compensation capacitor Ccom1 becomes smaller).

Pixel Circuit and Driving Method

Figure 5:
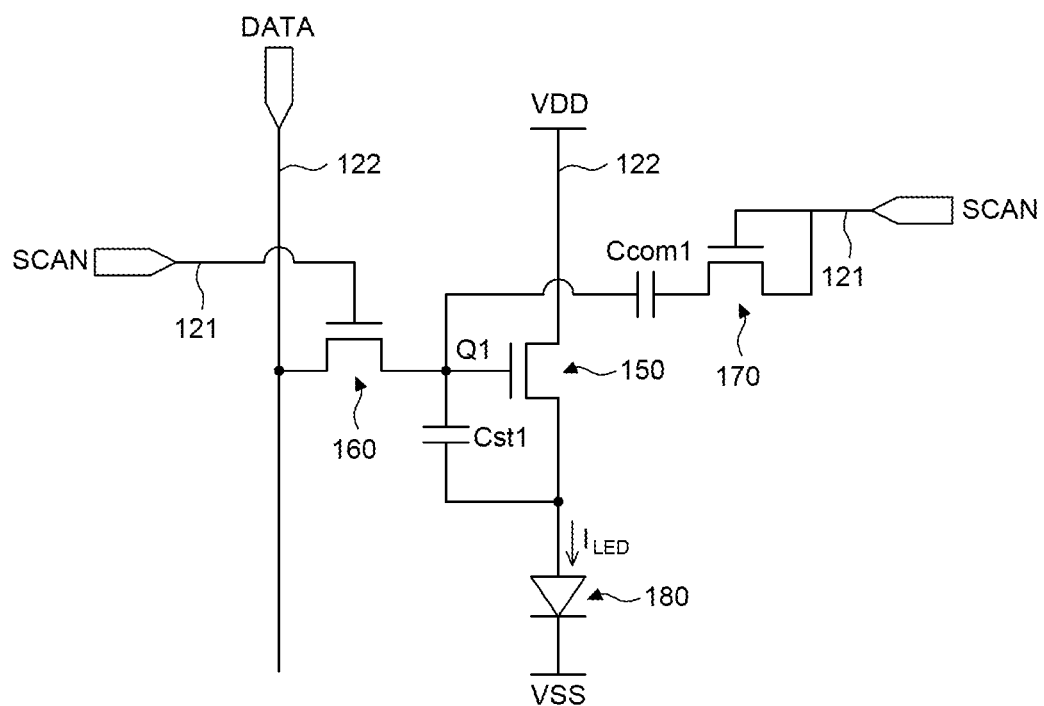
FIG. 5 is a circuit diagram of a pixel of a stretchable display device according to an embodiment of the present disclosure.
Figure 6:
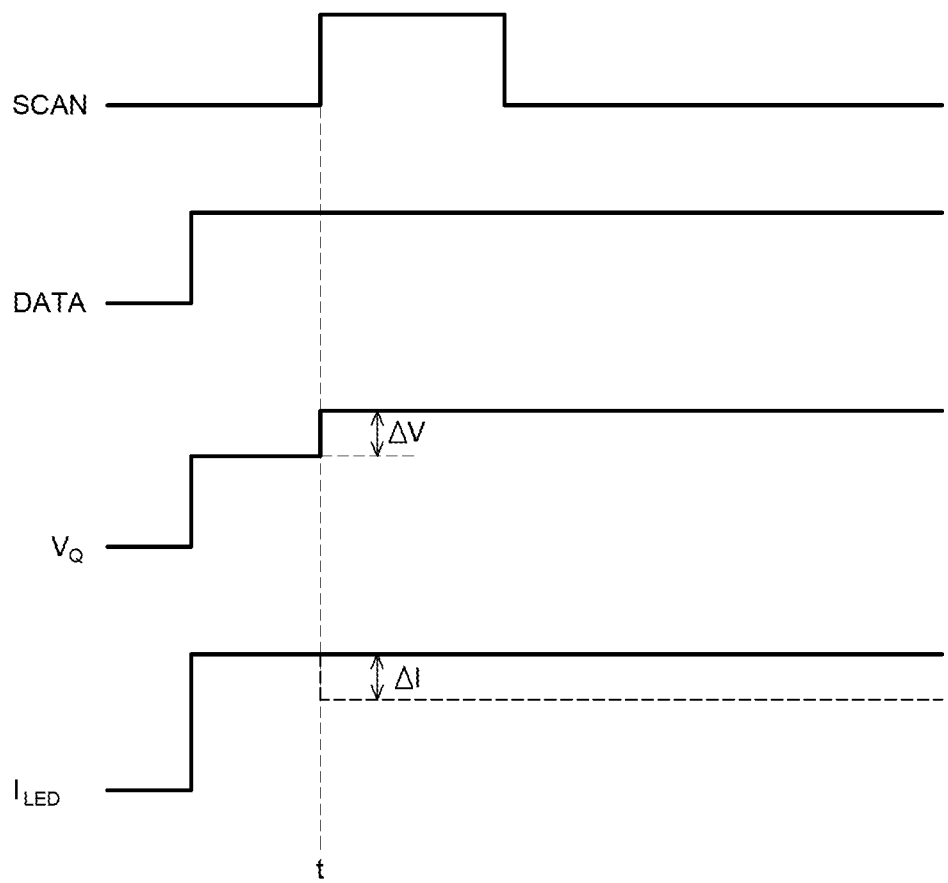
FIG. 6 is a signal timing chart of a stretchable display device according to an embodiment of the present disclosure.

FIG. 5 is a circuit diagram of a pixel of a stretchable display device according to an embodiment of the present disclosure. FIG. 6 is a signal timing chart of a stretchable display device according to an embodiment of the present disclosure.

Referring to FIG. 5, a sub-pixel of a stretchable display device according to an embodiment of the present disclosure includes a switching transistor 160, a driving transistor 150, a compensation transistor 170, a storage capacitor Cst1, and an LED 180.

The switching transistor 160, the driving transistor 150, and the compensation transistor 170 described above may be NMOS (e.g., n-type metal-oxide-semiconductor) transistors. A channel formed on the active layer in the NMOS transistor may be formed by electrons. That is, a carrier of the NMOS transistor is an electron. Therefore, a carrier mobility of the switching transistor 160, the driving transistor 150, and the compensation transistor 170 is improved so that a switching speed may be increased.

The switching transistor 160 is applied with a scan signal SCAN to output a data signal DATA to the driving transistor 150. Therefore, a gate electrode of the switching transistor 160 is connected to the first connection line 121 which outputs the scan signal SCAN and a drain electrode of the switching transistor 160 is connected to the second connection line 122 which outputs the data signal DATA. Further, a source electrode of the switching transistor 160 is connected to a Q node Q1 which is a gate electrode of the driving transistor 150. Therefore, when the scan signal SCAN which is output to the first connection line 121 is a high level, the switching transistor 160 is turned on to output the data signal DATA to the Q node Q1.

The driving transistor 150 is applied with the data signal DATA to apply a driving current ILEA corresponding thereto to the LED 180. Therefore, the gate electrode of the driving transistor 150 is connected to a Q node Q1 which is a source electrode of the switching transistor 160, and the drain electrode of the driving transistor 150 is connected to the first connection line 121 which applies a high potential common voltage VDD. Further, the source electrode of the driving transistor 150 is connected to the LED 180 which is a light emitting element. Therefore, when the data signal DATA is applied, the driving transistor 150 is turned on to apply a driving current $I_{LED}$ corresponding to a voltage between the gate electrode and the source electrode to the LED 180.

The storage capacitor Cst1 constantly maintains a voltage between the gate electrode and the source electrode of the driving transistor 150 for one frame. To this end, one electrode of the storage capacitor Cst1 is connected to the gate electrode of the driving transistor 150 and the other electrode of the storage capacitor Cst1 is connected to the source electrode of the driving transistor 150.

The compensation transistor 170 outputs the scan signal SCAN to the compensation capacitor Ccom1 in accordance with the scan signal SCAN. To this end, the gate electrode and the drain electrode of the compensation transistor 170 are connected to the first connection line 121 which outputs the scan signal SCAN and the source electrode of the compensation transistor 170 is connected to one electrode of the compensation capacitor Ccom1. Therefore, when the scan signal SCAN output to the first connection line 121 is a high level, the compensation transistor 170 is turned on to output the scan signal SCAN to one electrode of the compensation capacitor Ccom1.

The compensation capacitor Ccom1 bootstraps the voltage of the Q node Q1 in accordance with the scan signal SCAN. To this end, one electrode of the compensation capacitor Ccom1 is connected to the drain electrode of the compensation transistor 170 and the other electrode of the compensation capacitor Ccom1 is connected to the Q node Q1. Therefore, when the scan signal SCAN which is applied to one electrode of the compensation capacitor Ccom1 is a high level, the voltage of the Q node Q1 is bootstrapped so that the voltage rises.

In the above-described pixel circuit structure, the driving current $I_{LED}$ output from the source electrode of the driving transistor 150 may be expressed by Equation 2.

$$I_{LED} = k \times (Vgs - Vth)^2 k \times (V_Q - Vp - Vth)^2 \quad \text{[Equation 2]}$$

Here, $I_{LED}$ refers to a driving current, Vgs refers to a voltage between the gate electrode and the source electrode of the driving transistor 150, $V_Q$ refers to a voltage of the Q node Q1, Vp refers to a voltage of the p-electrode 185 of the LED 180, and Vth refers to a threshold voltage of the driving transistor 150. Further, k refers to a proportional factor.

When the stretchable display device is extended, the second connection line 122 is extended so that the resistance of the second connection line 122 may be increased. That is, the higher the extending degree of the second connection line 122, the higher the increased amount of the resistance of the second connection line 122. Therefore, the level of the data signal DATA output to the gate electrode of the driving transistor 150 by the second connection line 122 may be lowered. Consequently, the voltage between the gate electrode and the source electrode of the driving transistor 150 is lowered so that according to Equation 1, the driving current $I_{LED}$ may be lowered.

However, the stretchable display device of the present disclosure includes the compensation transistor 170 and the compensation capacitor Ccom1 so that the voltage of the Q node Q1 is bootstrapped to compensate for a lowered level of the data signal DATA. Consequently, the voltage between the gate electrode and the source electrode of the driving transistor 150 is compensated so that according to Equation 1, the driving current $I_{LED}$ may be compensated.

To be more specific, referring to FIGS. 5 and 6, at a timing t, the scan signal SCAN rises to a high level. Therefore, the switching transistor 160 is turned on so that the data signal DATA is applied to the Q node Q1. As described above, when the stretchable display device is extended, the resistance of the second connection line 122 is increased so that the level of the data signal DATA which is applied to the Q node Q1 may be lowered. Further, the compensation transistor 170 is also turned on so that a high level of scan signal SCAN may be applied to one electrode of the compensation capacitor Ccom1. Further, the voltage $V_Q$ of the Q node Q1 which is the other electrode of the compensation capacitor Ccom1 is bootstrapped by the high level of scan signal SCAN. Therefore, the voltage $V_Q$ of the Q node Q1 which is the gate electrode of the driving transistor 150 rises so that the voltage between the gate electrode and the source electrode of the driving transistor 150 may be compensated. As a result, the driving current $I_{LED}$ of the LED 180 may be compensated by a series of the above-described processes.

Moreover, according to Equation 3, it is confirmed that the change ΔCcom of the capacitance of the compensation capacitor Ccom1 is inversely proportional to the change ΔV of the voltage at both ends of the compensation capacitor Ccom1. However, it presupposes that an amount of charge Q charged in the compensation capacitor Ccom1 is constant.

$$\Delta V = \frac{Q}{\Delta Ccom} \quad \text{[Equation 3]}$$

Here, ΔCcom is a change of a capacitance of the compensation capacitor Ccom1, Q is an amount of charge charged in the compensation capacitor Ccom1, and ΔV is a change of a voltage at both ends of the compensation capacitor Ccom1.

As described above, it is confirmed that as the distance between the compensation transistor 170 formed on the first substrate ST1 and the driving transistor 150 formed on the second substrate ST2 is increased, the capacitance of the compensation capacitor Ccom1 is reduced. Therefore, according to Equation 3, the lower the capacitance of the compensation capacitor Ccom1, the higher the voltage at both ends of the compensation capacitor Ccom1. That is, when both Equations 1 and 3 are considered, as the distance between the compensation transistor 170 formed on the first substrate ST1 and the driving transistor 150 formed on the second substrate ST2 is increased, the amount ΔV of the increased voltage of the Q node by the compensation capacitor Ccom1 is increased.

In other words, when the stretchable display device is extended, as the extending degree of the second connection line 122 is increased, the amount of increased resistance of the second connection line 122 is also increased so that the level of the data signal DATA applied to the Q node Q1 may be further reduced. However, in the stretchable display device of the present disclosure, as the extending degree of the second connection line 122 is increased, the amount ΔV of increased voltage of the Q node Q1 by the compensation capacitor Ccom1 may be increased.

For example, as the distance between the first substrate ST1 and the second substrate ST2 is increased (or the distance between the first substrate ST1 and the second substrate ST2 becomes longer), a change of a capacitance of the compensation capacitor Ccom1 is decreased (or the change of a capacitance of the compensation capacitor Ccom1 becomes smaller). If the change of a capacitance of the compensation capacitor Ccom1 (which is ΔCcom) decreases, based on Equation 3, the change of a voltage (ΔV) at both ends of the compensation capacitor Ccom1 increases. This result in a larger voltage change of the gate electrode of the driving transistor 150.

Therefore, the voltage of the Q node Q1 may be increased in accordance with a voltage drop of the data signal DATA applied to the Q node Q1, so that the voltage of the Q node Q1 may be constantly maintained regardless of the extension rate of the stretchable display device. As a result, even though the stretchable display device is extended, the driving current LED is constantly maintained so that the uniform luminance of the stretchable display device may be achieved.

Another Embodiment of Present Disclosure

Figure 7:
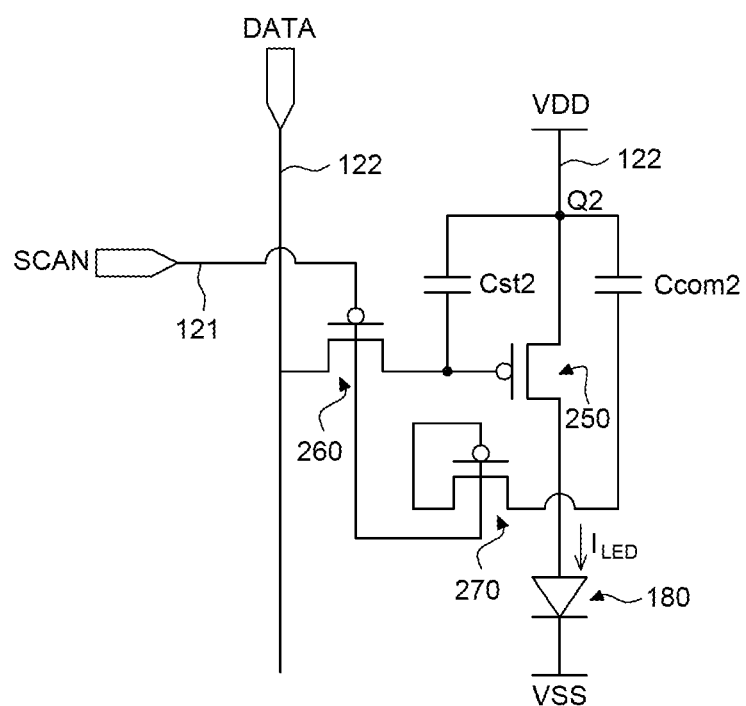
FIG. 7 is a circuit diagram of a pixel of a stretchable display device according to another embodiment of the present disclosure.
Figure 8:
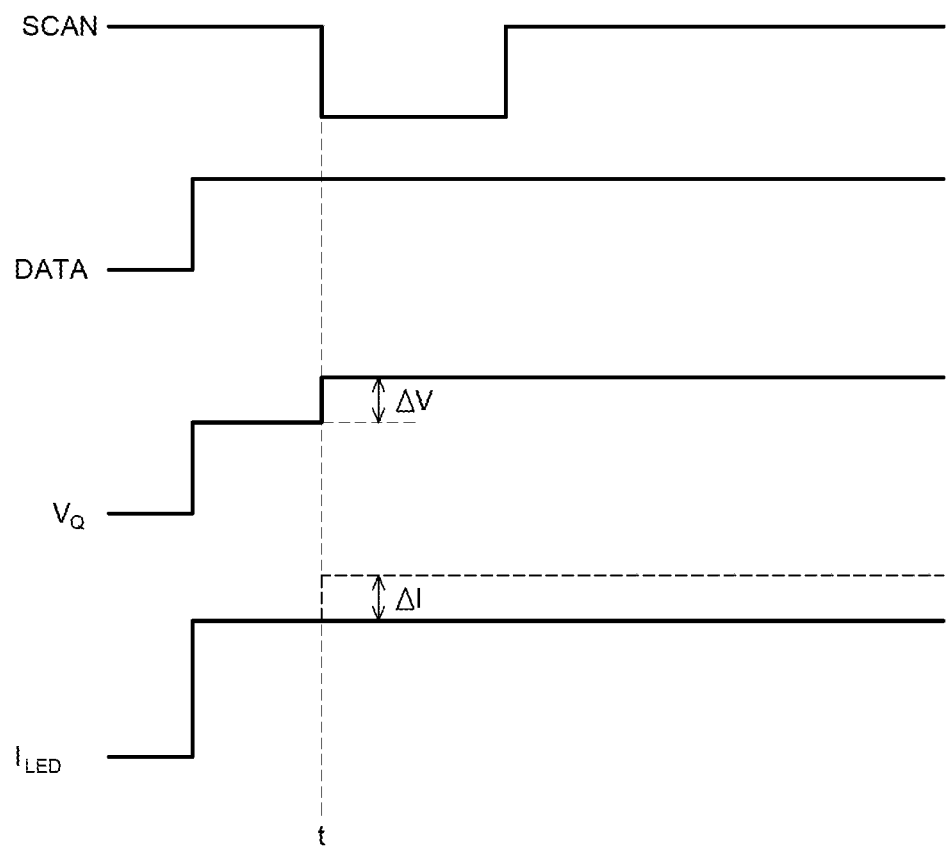
FIG. 8 is a signal timing chart of a stretchable display device according to another embodiment of the present disclosure.

FIG. 7 is a circuit diagram of a pixel of a stretchable display device according to another embodiment of the present disclosure. FIG. 8 is a signal timing chart of a stretchable display device according to another embodiment of the present disclosure.

The only difference between the stretchable display device according to the embodiment of the present disclosure and a stretchable display device according to another embodiment of the present disclosure is a type of a transistor and a pixel circuit connection relationship. However, a technical feature of the other components is the same. Therefore, hereinafter, a pixel circuit of a stretchable display device according to another embodiment of the present disclosure will be described in detail.

Referring to FIG. 7, a sub-pixel of a stretchable display device according to an embodiment of the present disclosure includes a switching transistor 260, a driving transistor 250, a compensation transistor 270, a storage capacitor Cst2, and a light emitting element.

The switching transistor 260, the driving transistor 250, and the compensation transistor 270 described above may be PMOS (e.g., p-type metal-oxide-semiconductor) transistors. A channel formed on the active layer in the PMOS transistor may be formed by holes. That is, a carrier of the PMOS transistor is a hole. Therefore, the reliability of the switching transistor 260, the driving transistor 250, and the compensation transistor 270 may be improved.

The switching transistor 260 is applied with a scan signal SCAN to output a data signal DATA to the driving transistor 250. Therefore, a gate electrode of the switching transistor 260 is connected to the first connection line 121 which outputs the scan signal SCAN and a source electrode of the switching transistor 260 is connected to the second connection line 122 which outputs the data signal DATA. Further, a drain electrode of the switching transistor 260 is connected to a gate electrode of the driving transistor 250. Therefore, when the scan signal SCAN output to the first connection line 121 is a high level, the switching transistor 260 is turned on to output the data signal DATA to the gate electrode of the driving transistor 250.

The driving transistor 250 is applied with the data signal DATA to apply a driving current $I_{LED}$ corresponding thereto to the LED 180. Therefore, the gate electrode of the driving transistor 250 is connected to the drain electrode of the switching transistor 260 and the source electrode of the driving transistor 250 is connected to the first connection line 121 which applies a high potential common voltage VDD. Further, the drain electrode of the driving transistor 250 is connected to the LED 180 which is a light emitting element. Therefore, when the data signal DATA is applied, the driving transistor 250 is turned on to apply a driving current corresponding to a voltage between the gate electrode and the source electrode to the LED 180.

The storage capacitor Cst2 constantly maintains a voltage between the gate electrode and the source electrode of the driving transistor 250 for one frame. To this end, one electrode of the storage capacitor Cst2 may be connected to the gate electrode of the driving transistor 250 and the other electrode of the storage capacitor Cst2 may be connected to the source electrode of the driving transistor 250.

The compensation transistor 270 outputs the scan signal SCAN to the compensation capacitor Ccom2 in accordance with the scan signal SCAN. To this end, the gate electrode and the source electrode of the compensation transistor 270 are connected to the first connection line 121 which outputs the scan signal SCAN and the drain electrode of the compensation transistor 270 may be connected to one electrode of the compensation capacitor Ccom2. Therefore, when the scan signal SCAN output to the first connection line 121 is a high level, the compensation transistor 270 is turned on to output the scan signal SCAN to one electrode of the compensation capacitor Ccom2.

The compensation capacitor Ccom2 bootstraps the voltage of the Q node Q2 in accordance with the scan signal SCAN. To this end, one electrode of the compensation capacitor Ccom2 is connected to the drain electrode of the compensation transistor 270 and the other electrode of the compensation capacitor Ccom2 is connected to the Q node Q2 which is the source electrode of the driving transistor 250. Therefore, when the scan signal SCAN which is applied to one electrode of the compensation capacitor Ccom2 is a high level, the voltage of the Q node Q2 is bootstrapped so that the voltage rises.

In the above-described pixel circuit structure, the driving current output from the source electrode of the driving transistor 250 may be expressed by Equation 4.

$$I_{LED}=k\times(Vgs-Vth)^2=k\times(V\text{data}-V_Q-Vth)^2 \quad [\text{Equation 4}]$$

Here, $I_{LED}$ refers to a driving current, Vgs refers to a voltage between the gate electrode and the source electrode of the driving transistor 250, $V_{data}$ refers to a voltage of the data signal DATA, $V_Q$ refers to a voltage of the Q node Q2, and Vth refers to a threshold voltage of the driving transistor 250. Further, k refers to a proportional factor.

When the stretchable display device is extended, the first connection line 121 is extended so that the resistance of the first connection line 121 may be increased. That is, the higher the extending degree of the first connection line 121, the higher the increased amount of the resistance of the first connection line 121. Therefore, the level of the high potential common voltage VDD which is applied to the source electrode of the driving transistor 250 by the first connection line 121 may be lowered. Consequently, the voltage between the gate electrode and the source electrode of the driving transistor 250 is increased so that according to Equation 4, the driving current $I_{LED}$ may be increased.

However, the stretchable display device of the present disclosure includes the compensation transistor 270 and the compensation capacitor Ccom2 so that the voltage of the Q node Q2 is bootstrapped to compensate for a level of the high potential common voltage VDD. Consequently, the voltage between the gate electrode and the source electrode of the driving transistor 250 is compensated so that according to Equation 1, the driving current may be compensated.

To be more specific, referring to FIGS. 7 and 8, at a timing t, the scan signal SCAN is lowered to a low level. Therefore, the switching transistor 260 is turned on so that the data signal DATA is applied to the gate electrode of the driving transistor 250. As described above, when the stretchable display device is extended, the resistance of the first connection line 121 is increased so that the level of the high potential common voltage VDD which is applied to the Q node Q2 may be lowered. Further, the compensation transistor 270 is also turned on and the low level of scan signal SCAN is inverted due to bubbles of the gate electrode. Therefore, the high level of scan signal SCAN may be applied to one electrode of the compensation capacitor Ccom2. Further, the voltage $V_Q$ of the Q node Q2 which is the other electrode of the compensation capacitor Ccom2 is bootstrapped by the high level of scan signal SCAN. Therefore, the voltage $V_Q$ of the Q node Q2 which is the source electrode of the driving transistor 250 rises so that the voltage between the gate electrode and the source electrode of the driving transistor 250 may be compensated. As a result, the driving current $I_{LED}$ of the LED 180 may be compensated by a series of the above-described processes.

As described above, it is confirmed that as the distance between the compensation transistor 270 formed on the first substrate ST1 and the driving transistor 250 formed on the second substrate ST2 is increased, the capacitance of the compensation capacitor Ccom2 is reduced. According to Equation 3, it is confirmed that as the distance between the compensation transistor 270 formed on the first substrate ST1 and the driving transistor 250 formed on the second substrate ST2 is increased, a voltage change at both ends of the compensation capacitor Ccom2 is increased. That is, when both Equations 1 and 3 are considered, as the distance between the compensation transistor 270 formed on the first substrate ST1 and the driving transistor 250 formed on the second substrate ST2 is increased, the amount ΔV of the increased voltage of the Q node by the compensation capacitor Ccom2 is increased.

In other words, when the stretchable display device is extended, as the extending degree of the first connection line 121 is increased, the amount of increased resistance of the first connection line 121 is also increased so that the level of the high potential common voltage VDD applied to the Q node Q2 may be further reduced. However, in the stretchable display device of the present disclosure, as the extending degree of the first connection line 121 is increased, the amount ΔV of increased voltage of the Q node Q2 by the compensation capacitor Ccom2 may be increased.

Therefore, the voltage of the Q node Q2 may be increased in accordance with a voltage drop of the high potential common voltage VDD applied to the Q node Q2, so that the voltage of the Q node Q2 may be constantly maintained regardless of the extension rate of the stretchable display device. As a result, even though the stretchable display device is extended, the driving current $I_{LED}$ is constantly maintained so that the uniform luminance of the stretchable display device may be achieved.

Still Another Embodiment of Present Disclosure

Figure 9:
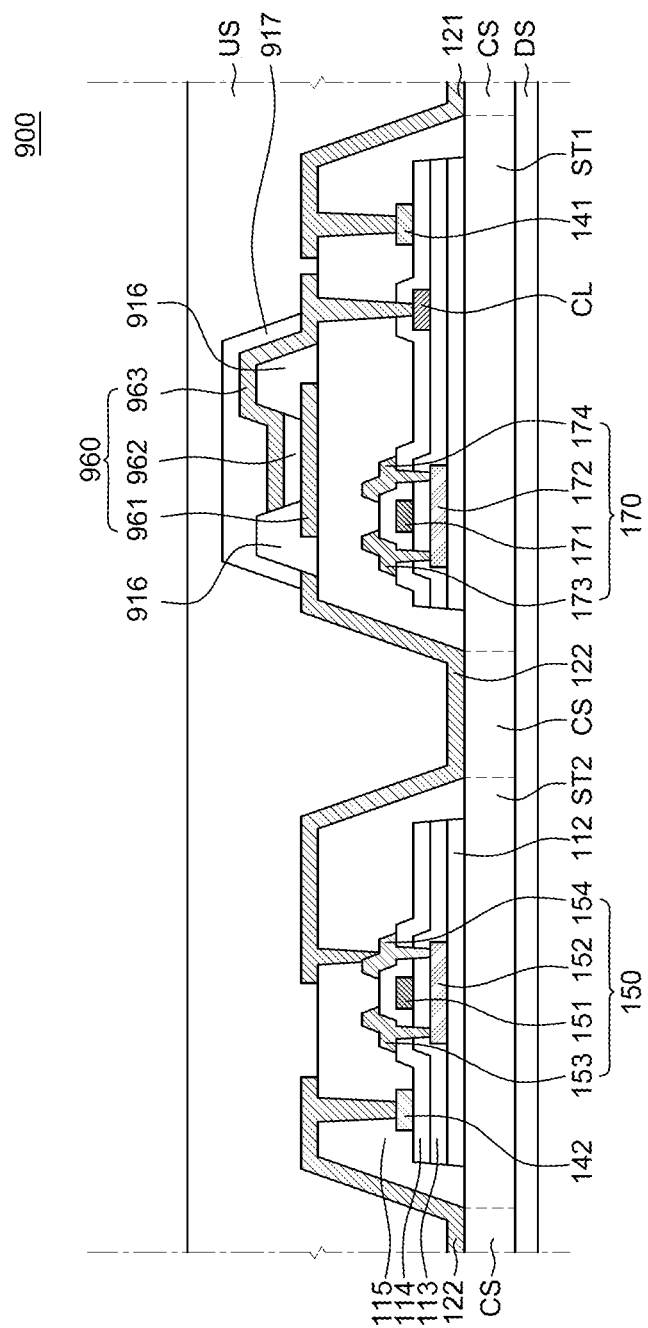
FIG. 9 is a cross-sectional view of a stretchable display device according to still another embodiment of the present disclosure.

FIG. 9 is a cross-sectional view of a stretchable display device according to still another embodiment of the present disclosure.

The only difference between the stretchable display device according to the embodiment of the present disclosure and a stretchable display device according to still another embodiment of the present disclosure is that the light emitting element is not an LED, but an organic light emitting element. However, a technical feature of the other components is the same. Therefore, hereinafter, an organic light emitting element of a stretchable display device according to still another embodiment of the present disclosure will be described in detail.

Referring to FIG. 9, a bank 916, an encapsulation layer 917, and an organic light emitting element 960 are disposed on a planarization layer 115.

An organic light emitting element 960 is disposed to correspond to each of the plurality of sub-pixels and emits light having a specific wavelength band. That is, the organic light emitting element 960 may be a blue organic light emitting element which emits blue light, a red organic light emitting element which emits red light, a green organic light emitting element which emits green light, or a white organic light emitting element which emits white light, but is not limited thereto. When the organic light emitting element 960 is a white organic light emitting element, the stretchable display device 900 may further include a color filter.

The organic light emitting element 960 includes an anode 961, an organic light emitting layer 962, and a cathode 963. Specifically, the anode 961 is disposed on the planarization layer 115. The anode 961 is an electrode configured to supply holes to the organic light emitting layer 962.

The anodes 961 are disposed to be spaced apart from each other for each of the sub-pixels to be electrically connected to the driving transistor 150 through a second connection line 122. For example, in FIG. 9, it is illustrated that the anode 961 is electrically connected to the drain electrode 154 of the driving transistor 150, but the anode 961 may be electrically connected to the source electrode 153.

The anode 961 may be configured by the same metal material as the second connection line. Specifically, the anode 961 may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

The bank 916 is disposed on the anode 961 and the planarization layer 115. The bank 916 is a component which divides adjacent sub-pixels. The bank 916 is disposed to cover at least a part of both sides of the adjacent anode 961 to expose a part of a top surface of the anode 961. The bank 916 may suppress a problem in that a current is concentrated at the corner of the anode 961 to emit the light to the side surface of the anode 961 so that an unintended sub-pixel emits light or colors are mixed. The bank 916 may be formed of acrylic resin, benzocyclobutene (BCB) resin, or polyimide, but is not limited thereto.

The organic light emitting layer 962 is disposed on the anode 961. The organic light emitting layer 962 is configured to emit light. The organic light emitting layer 962 may include a luminescent material and the luminescent material may include a phosphorescent material or a fluorescent material but is not limited thereto.

The organic light emitting layer 962 may be configured by one light emitting layer. Alternatively, the organic light emitting layer 962 may have a stack structure in which a plurality of light emitting layers laminated with a charge generation layer therebetween is laminated. The organic light emitting layer 962 may further include at least one organic layer of a hole transport layer, an electron transport layer, a hole blocking layer, an electron blocking layer, a hole injection layer, and an electron injection layer.

Referring to FIG. 9, the cathode 963 is disposed on the organic light emitting layer 962. The cathode 963 is connected to the common line CL through a contact hole formed in the planarization layer 115 to supply electrons to the organic light emitting layer 962. The cathode 963 may be formed of a transparent conductive oxide such as indium tin oxide (ITO), indium zinc oxide (IZO), indium tin zinc oxide (ITZO), zinc oxide (ZnO), and tin oxide (TO) or ytterbium (Yb) alloy. Therefore, the light generated in the organic light emitting layer 962 may be upwardly emitted.

The cathode 963 may be patterned to respectively overlap with the plurality of first substrates ST1. That is, the cathode 963 is formed only in an area overlapping with the plurality of first substrates ST1 and may not be formed in an area between the plurality of first substrates ST1. Since the cathode 963 is formed of a material such as a transparent conductive oxide or a metal material, when the cathode 963 is formed in the area between the plurality of first substrates ST1, the cathode 963 may be damaged during the process of stretching the stretchable display device 900. Therefore, the cathode 963 may be formed so as to correspond to each of the plurality of first substrates ST1 on a flat surface.

Referring to FIG. 9, an encapsulation layer 917 is disposed on the organic light emitting element 960. The encapsulation layer 917 covers the organic light emitting element 960 and is in contact with a part of the top surface of the bank 916 to seal the organic light emitting element 960. Therefore, the encapsulation layer 917 protects the organic light emitting element 960 from moisture, air, or physical impact permeating from the outside.

The encapsulation layers 917 may cover the cathodes 963 which are patterned to overlap with the plurality of first substrates ST1 and may be formed above each of the plurality of first substrates ST1. That is, the encapsulation layer 917 is disposed so as to cover one cathode 963 disposed on one first substrate ST1 and the encapsulation layer 917 disposed on each of the plurality of first substrates ST1 may be spaced apart from each other.

The encapsulation layer 917 may be formed only in an area overlapping with the plurality of first substrates ST1. As described above, the encapsulation layer 917 may be configured to include an inorganic material so that the encapsulation layer may be easily cracked or damaged during a process of stretching the stretchable display device 900. Specifically, since the organic light emitting element 960 is vulnerable to the moisture or oxygen, when the encapsulation layer 917 is damaged, the reliability of the organic light emitting element 960 may be reduced. Therefore, in the stretchable display device 900 according to the embodiment of the present disclosure, the encapsulation layer 917 is not formed in an area between the plurality of first substrates ST1. Therefore, even though the stretchable display device 900 is bent or stretched to be deformed, the damage of the encapsulation layer 917 may be reduced or minimized.

The embodiments of the present disclosure can also be described as follows:

According to an aspect of the present disclosure, a stretchable display device includes a lower substrate including a display area and a non-display area; a plurality of first substrates and a plurality of second substrates disposed in the display area; a plurality of light emitting elements disposed on each of the plurality of first substrates; a switching transistor and a driving transistor disposed on each of the plurality of second substrates, in which the switching transistor may output a data signal to the driving transistor in accordance with a scan signal and the driving transistor may output a driving current to the light emitting element in accordance with the data signal.

The stretchable display device may further comprise a compensation transistor on each of the plurality of first substrates.

The stretchable display device may further comprise a compensation capacitor formed between the driving transistor and the compensation transistor.

The longer a distance between each of the plurality of first substrates and each of the plurality of second substrates, the smaller a capacitance of the compensation capacitor.

The switching transistor, the driving transistor, and the compensation transistor may be NMOS transistors.

The scan signal may be applied to a gate electrode and a drain electrode of the compensation transistor.

One electrode of the compensation capacitor may be connected to a source electrode of the compensation transistor and the other electrode of the compensation capacitor may be connected to a gate electrode of the driving transistor.

The compensation capacitor may bootstrap a voltage applied to the gate electrode of the driving transistor.

The longer a distance between each of the plurality of first substrates and each of the plurality of second substrates, the larger a voltage change of the gate electrode of the driving transistor.

The switching transistor, the driving transistor, and the compensation transistor may be PMOS transistors.

The scan signal may be applied to a gate electrode and a source electrode of the compensation transistor.

One electrode of the compensation capacitor may be connected to a drain electrode of the compensation transistor and the other electrode of the compensation capacitor may be connected to a source electrode of the driving transistor.

The compensation capacitor may bootstrap a voltage applied to the source electrode of the driving transistor.

The longer a distance between each of the plurality of first substrates and each of the plurality of second substrates, the larger a voltage change of the source electrode of the driving transistor.

The light emitting element may be an LED.

The light emitting element may be an organic light emitting element.

According to another aspect of the present disclosure, a stretchable display device includes a soft substrate including a display area and a non-display area; a first rigid substrate and a second rigid substrate which are disposed in the display area and are adjacent to each other; and a plurality of sub-pixels disposed on the first rigid substrate and the second rigid substrate, and each of the plurality of sub-pixels includes: a light emitting element and a compensation transistor disposed on the first substrate; a driving transistor disposed on the second substrate; and a compensation capacitor formed between the first substrate and the second substrate.

The longer a distance between the first rigid substrate and the second rigid substrate, the smaller a capacitance of the compensation capacitor.

The compensation capacitor bootstraps a voltage applied to one electrode of the driving transistor.

The longer a distance between the first rigid substrate and the second rigid substrate, the larger a voltage change of one electrode of the driving transistor.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display device, comprising:
   a lower substrate having thereon a display area and a non-display area;
   a plurality of first substrates and a plurality of second substrates disposed in the display area;
   a plurality of light emitting elements and a compensation transistor disposed on each of the plurality of first substrates;
   a switching transistor and a driving transistor disposed on each of the plurality of second substrates; and
   a compensation capacitor positioned between the driving transistor and the compensation transistor,
   wherein the switching transistor is configured to output a data signal to the driving transistor based on a scan signal and the driving transistor is configured to output a driving current to at least one of the light emitting element based on the data signal, and
   wherein as a distance between each of the plurality of first substrates and a corresponding one of the plurality of second substrates becomes longer, a capacitance of the compensation capacitor becomes smaller.

2. The stretchable display device according to claim 1, wherein the switching transistor, the driving transistor, and the compensation transistor are NMOS transistors.

3. The stretchable display device according to claim 2, wherein the scan signal is applied to a gate electrode and a drain electrode of the compensation transistor.

4. The stretchable display device according to claim 3, wherein one electrode of the compensation capacitor is connected to a source electrode of the compensation transistor and the other electrode of the compensation capacitor is connected to a gate electrode of the driving transistor.

5. The stretchable display device according to claim 4, wherein the compensation capacitor bootstraps a voltage applied to the gate electrode of the driving transistor.

6. The stretchable display device according to claim 5, wherein the longer a distance between each of the plurality of first substrates and a corresponding one of the plurality of second substrates, the larger a voltage change of the gate electrode of the driving transistor.

7. The stretchable display device according to claim 1, wherein the switching transistor, the driving transistor, and the compensation transistor are PMOS transistors.

8. The stretchable display device according to claim 7, wherein the scan signal is applied to a gate electrode and a source electrode of the compensation transistor.

9. The stretchable display device according to claim 8, wherein one electrode of the compensation capacitor is connected to a drain electrode of the compensation transistor and the other electrode of the compensation capacitor is connected to a source electrode of the driving transistor.

10. The stretchable display device according to claim 9, wherein the compensation capacitor bootstraps a voltage applied to the source electrode of the driving transistor.

11. The stretchable display device according to claim 10, wherein the longer a distance between each of the plurality of first substrates and each of the plurality of second substrates, the larger a voltage change of the source electrode of the driving transistor.

12. The stretchable display device according to claim 1, wherein the light emitting element is a light emitting diode.

13. The stretchable display device according to claim 1, wherein the light emitting element is an organic light emitting element.

14. A stretchable display device, comprising:
a soft substrate having thereon a display area and a non-display area;
a first rigid substrate and a second rigid substrate which are disposed in the display area and are adjacent to each other; and
a plurality of sub-pixels disposed on the first rigid substrate and the second rigid substrate,
wherein each of the plurality of sub-pixels includes:
a light emitting element disposed on the first rigid substrate;
a compensation transistor disposed on the first rigid substrate;
a driving transistor disposed on the second rigid substrate; and
a compensation capacitor positioned between the first rigid substrate and the second rigid substrate.

15. The stretchable display device according to claim 14, wherein the longer a distance between the first rigid substrate and the second rigid substrate, the smaller a capacitance of the compensation capacitor.

16. The stretchable display device according to claim 14, wherein the compensation capacitor bootstraps a voltage applied to one electrode of the driving transistor.

17. The stretchable display device according to claim 16, wherein the longer a distance between the first rigid substrate and the second rigid substrate, the larger a voltage change of the one electrode of the driving transistor.

* * * * *